United States Patent
Yamakawa et al.

(10) Patent No.: US 9,605,815 B2
(45) Date of Patent: Mar. 28, 2017

(54) WHITE LIGHT SOURCE AND WHITE LIGHT SOURCE SYSTEM INCLUDING THE SAME

(71) Applicants: KABUSHIKI KAISHA TOSHIBA, Tokyo (JP); TOSHIBA MATERIALS CO., LTD., Yokohama-shi, Kanagawa-ken (JP)

(72) Inventors: Masahiko Yamakawa, Yokohama (JP); Yasuhiro Shirakawa, Yokohama (JP)

(73) Assignees: KABUSHIKI KAISHA TOSHIBA, Tokyo (JP); TOSHIBA MATERIALS CO., LTD., Yokohama-Shi (JP)

( * ) Notice: Subject to any disclaimer, the term of this patent is extended or adjusted under 35 U.S.C. 154(b) by 0 days.

(21) Appl. No.: 14/356,275

(22) PCT Filed: Oct. 19, 2012

(86) PCT No.: PCT/JP2012/077087
§ 371 (c)(1),
(2) Date: May 5, 2014

(87) PCT Pub. No.: WO2013/069435
PCT Pub. Date: May 16, 2013

(65) Prior Publication Data
US 2014/0307417 A1    Oct. 16, 2014

(30) Foreign Application Priority Data
Nov. 7, 2011 (JP) .................. 2011-243992

(51) Int. Cl.
*F21V 3/04* (2006.01)
*H01L 33/50* (2010.01)
(Continued)

(52) U.S. Cl.
CPC ............ *F21K 9/56* (2013.01); *F21K 9/232* (2016.08); *F21K 9/64* (2016.08); *F21V 3/04* (2013.01);
(Continued)

(58) Field of Classification Search
CPC ... F21K 9/56; F21K 9/232; F21K 9/64; H01L 33/504; H01L 2924/0002;
(Continued)

(56) References Cited

U.S. PATENT DOCUMENTS 6,853,151 B2 * 2/2005 Leong et al. ............. 315/185 R
2006/0027781 A1  2/2006 Dong et al.
(Continued)

FOREIGN PATENT DOCUMENTS

EP    2 674 662 A1   12/2013
EP    2 701 213 A1    2/2014
(Continued)

OTHER PUBLICATIONS

English translation of claims for 2011-066108 dated May 5, 2014, date of reference is Mar. 31, 2011, Mitsubishi.*
(Continued)

*Primary Examiner* — Sharon Payne
(74) *Attorney, Agent, or Firm* — Foley & Lardner LLP

(57) ABSTRACT

The present invention provides a white light source comprising a light emitting diode having a light emission peak wavelength of 350 to 490 nm and a phosphor that emits visible light upon excitation by a light emitted from the light emitting diode; wherein, with respect to an arbitrary local maximum value of light-emission intensity between 350 and 780 nm of a light emission spectrum of the white light source, a ratio of a local minimum value of light-emission intensity that is closest on a long wavelength side to the local maximum value is such that, when the local maximum value (Continued)

is taken as 1, the local minimum value is 0.5 or more. It is preferable that, with respect to an arbitrary local maximum value of light-emission intensity between 350 and 780 nm of a light emission spectrum of the white light source, a ratio of a local minimum value of light-emission intensity that is closest on a long wavelength side to the local maximum value is such that, when the local maximum value is taken as 1, the local minimum value is 0.7 or more. According to the above structure, there can be provided a white light source capable of preventing a specified wavelength region from protruding in the light emission spectrum, and capable of visually perceiving the color tone of the irradiation object as the same state where the object is irradiated with sunlight.

9 Claims, 8 Drawing Sheets

(51) Int. Cl.
*F21V 9/16* (2006.01)
*F21K 99/00* (2016.01)
*F21K 9/232* (2016.01)
*F21K 9/64* (2016.01)
*H01L 25/075* (2006.01)
*F21Y 101/00* (2016.01)

(52) U.S. Cl.
CPC .............. *F21V 9/16* (2013.01); *H01L 33/504* (2013.01); *F21Y 2101/00* (2013.01); *H01L 25/0753* (2013.01); *H01L 2924/0002* (2013.01)

(58) Field of Classification Search
CPC .......... H01L 25/0753; F21V 3/04; F21V 9/16; F21Y 2101/00
See application file for complete search history.

(56) References Cited

U.S. PATENT DOCUMENTS

| | | |
|---|---|---|
| 2007/0235751 A1 | 10/2007 | Radkov et al. |
| 2009/0224652 A1 | 9/2009 | Li et al. |
| 2010/0045168 A1 | 2/2010 | Su et al. |

FOREIGN PATENT DOCUMENTS

| | | | |
|---|---|---|---|
| JP | 10-242513 A | 9/1998 | |
| JP | 2009-065137 A | 3/2009 | |
| JP | 2011-066108 A | 3/2011 | |
| KR | 756465 B1 * | 9/2007 | ............. F21D 23/00 |
| WO | WO 2007/037120 A1 | 4/2007 | |
| WO | WO-2011/112494 A1 | 9/2011 | |

OTHER PUBLICATIONS

English translation of specificaiton for 2011-066108 dated May 5, 2014, date of reference is Mar. 31, 2011, Mitsubishi.*

* cited by examiner

WHITE LIGHT SOURCE AND WHITE LIGHT SOURCE SYSTEM INCLUDING THE SAME

TECHNICAL FIELD

The present invention relates to a white light source and a white light source system including the white light source. More particularly, the present invention relates to a white light source with which color tones (colorations) of an irradiated object appear the same as when irradiated with sunlight, and a white light source system including the white light source.

BACKGROUND ART

In recent years, white light sources including light emitting diodes (LEDs) have been attracted attention in terms of energy saving measures and a reduction in the amount of emitted carbon dioxide. Compared with conventional incandescent bulbs including tungsten filaments, LEDs have longer service life, and enable energy saving. As disclosed in Japanese Patent Laid-Open No. 10-242513 (Patent Document 1), in conventional white LEDs, YAG phosphors are excited using blue LEDs each having a light emission peak wavelength in a range of 400 to 530 nm, and the blue light emitted from the LEDs and the yellow light emitted from the YAG phosphors are mixed with each other, whereby a white light is achieved.

White light sources that use LEDs have been widely used as backlights of traffic signal lights and liquid crystal displays as well as general lighting equipment such as room lights. In the light emission spectra of conventional white light sources including blue LEDs, the peak height of the blue light emitted from the blue LEDs is as large as at least 1.5 times the peak height of the yellow light emitted from phosphors, and hence influences of the blue light tends to be strong. FIG. 1 shows a light emission spectrum of a white light source described in Patent Document 1.

Under the circumstances, with the popularization of the white light sources including LEDs, diverse demands are being made with respect to white light sources. With the white light sources in which blue light emitting diodes and YAG phosphors are combined as described in Patent Document 1, there have been arisen the problems that the light may appear yellowish depending on the viewing direction and that irregular colors of blue or yellow may arise.

In order to solve such problems, for example, the pamphlet of International Publication No. WO 2007/037120 (Patent Document 2) discloses a white light source in which an ultraviolet light emitting diode and phosphors are combined. A white light source having high color rendering properties is realized by combining the ultraviolet light emitting diode and three types of phosphor, namely, a blue phosphor, a green phosphor, and a red phosphor, thereby to realize a white light source having a high color rendering property. FIG. 2 illustrates a light emission spectrum of the white light source described in Patent Document 2.

In the white light source described in Patent Document 2, in order to achieve high color rendering properties, a light emission peak in a red region is set so as to be high as shown in FIG. 2. When illumination is performed by using the white light source having such a light emission spectrum, the color tones of an object of irradiation (object illuminated by the light) can be seen clearly. On the other hand, when clothes or the like are illuminated, in some cases a significant difference may be perceived between the tones when the clothes or the like are irradiated with a white light source having high color rendering properties and the tones that are perceived under irradiation with sunlight. That is, with respect to the case of irradiation with a white light source having high color rendering properties and the case of irradiation with sunlight, the problem arises that a significant difference in color tone is perceived even though the object of irradiation is the same.

PRIOR ART DOCUMENTS

Patent Documents

Patent Document 1: Japanese Patent Laid-Open No. 10-242513
Patent Document 2: the pamphlet of International Publication No. WO 2007/037120

SUMMARY OF THE INVENTION

Problems to be Solved by the Invention

Human perception of the color of an object is a process in which a light from a light source is irradiated onto the object, and a reflected light from the object is perceived by a human. Spectral components of the reflected light can be expressed as the product of the light emission spectrum of the light source and the reflection spectrum of the object. Sunlight is also referred to as "black-body radiation". Black-body radiation has a light emission spectrum that corresponds with a color temperature, and has a light emission spectrum without bumps and dips (irregularities).

On the other hand, in the case of the white light sources having the spectral distributions shown in FIG. 1 (Patent Document 1) and FIG. 2 (Patent Document 2), there are many bumps and dips in the respective light emission spectrums thereof. Therefore, with respect to light that is reflected when an object is irradiated using the aforementioned light sources, respectively, the spectrum of the reflected light also has bumps and dips that correspond to the bumps and dips in the light emission spectrum of the white light source. If the bumps and dips in the reflected light are large, the reflected light will lack a specific wavelength in the visible light region, and the appearance of the color of an object will change. That is, the problem arises that a divergence from the spectrum of black-body radiation increases because the bumps and dips of the light emission spectrum of the white light source are large, and consequently the way in which the tones are perceived differs.

The present invention, which has been made in order to deal with such a problem, has an object to provide a white light source with which the appearance of the color tones of an irradiation object are equivalent to the appearance of the tones when the object is irradiated with sunlight.

Means for Solving the Problems

In order to achieve the above-mentioned object, a white light source according to the present invention is a white light source including: a light emitting diode having a light emission peak wavelength of 350 to 490 nm; and a phosphor that emits visible light upon excitation by light emitted from the light emitting diode, in which, with respect to an arbitrary local maximum value of light-emission intensity between 350 and 780 nm of a light emission spectrum of the white light source, a ratio of a local minimum value of light-emission intensity that is closest on a long wavelength side to the local maximum value is such that, when the local maximum value is taken as 1, the local minimum value is 0.5 or more.

It is preferable that, with respect to an arbitrary local maximum value of light-emission intensity between 350 and 780 nm of a light emission spectrum of the white light source, a ratio of a local minimum value of light-emission intensity that is closest on a long wavelength side to the local maximum value is such that, when the local maximum value is taken as 1, the local minimum value is 0.7 or more. Further, it is also preferable that a color temperature of a white light is between 2,500 and 7,000 K.

It is preferable that a maximum peak intensity of the light emission spectrum of the white light source is within a range of 491 to 780 nm. In addition, it is preferable that the white light source includes three or more types of phosphor having different light emission peak wavelengths. Further, it is preferable that the white light source includes at least one or more regions at which light emission spectrums of the light emitting diode and three or more types of phosphor having different light emission peak wavelengths overlap. Furthermore, it is also preferable that the white light source includes a phosphor for which a half-value width of the light emission spectrum is 50 nm or more.

In addition, it is also preferable that the white light source is a white light source that is used for task illumination. Further, it is also preferable that the white light source is used in illumination for illuminating any one kind or more among printed matter, foodstuff, and a human. Furthermore, it is also preferable that a distance between the white light source and an object of irradiation is 1.5 m or less.

Further, a white light source system according to the present invention includes a plurality of the white light sources of the present invention.

Advantage of the Invention

A white light source according to the present invention reduces bumps and dips (irregularities) in a light emission spectrum, and hence the color tones of an object can be perceived in a similar manner to when the object is irradiated with sunlight.

DESCRIPTION OF EMBODIMENTS

Figure 1:
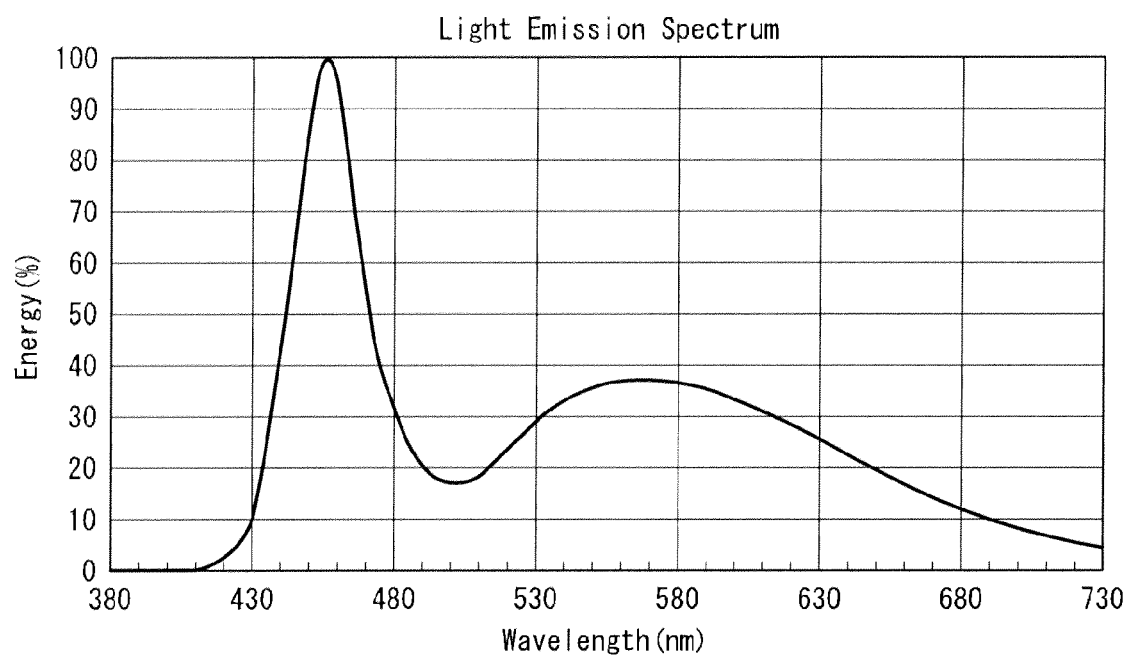
FIG. 1 is a graph showing a light emission spectrum of a white light source in Patent Document 1.

A white light source according to the present invention is a white light source including a light emitting diode having a light emission peak wavelength equal to or greater than 350 nm and less than or equal to 490 nm and a phosphor that emits visible light upon excitation by a light emitted from the light emitting diode, in which, with respect to an arbitrary local maximum value of light-emission intensity between 350 and 780 nm of a light emission spectrum of the white light source, a ratio of a local minimum value of light-emission intensity that is closest on a long wavelength side to the local maximum value is such that, when the local maximum value is taken as 1, the local minimum value is 0.5 or more.

The following light emitting diodes are used as a light emitting diode having a light emission peak wavelength equal to or greater than 350 nm and less than or equal to 490 nm. That is, a light emitting diode (LED) that emits so-called ultraviolet light, violet light or blue light is used. Light emitting diodes that have a light emission peak in this region are suitable for exciting phosphors, and white light can be obtained by using various phosphors that are described later.

A feature of the white light source according to the present invention is that with respect to an arbitrary local maximum value of light-emission intensity between 350 and 780 nm of a light emission spectrum of the white light source, a ratio of a local minimum value of light-emission intensity that is closest on a long wavelength side to the local maximum value is such that, when the local maximum value is taken as 1, the local minimum value is 0.5 or more. Note that the light emission spectrum of the white light source is measured according to total luminous flux measurement using an integrating sphere in conformity with JIS-C-8152.

Next, a light emission spectrum when a maximum peak intensity between the wavelengths of 350 nm and 780 nm with respect to the light emission spectrum of the white light source is taken as 1 will be described. A feature according to the present invention is that if a local maximum value of light-emission intensity and also a local minimum value of light-emission intensity that is closest to the local maximum value of light-emission intensity exist in the light emission spectrum of the white light source, the local maximum value of light-emission intensity is taken as 1, and a ratio between the local maximum value and the local minimum value (peak height of local minimum value of light-emission intensity/peak height of local maximum value of light-emission intensity) is 0.5 or more.

The term "local maximum value of light-emission intensity" (hereunder, referred to simply as "local maximum value") refers to a maximum value of a portion at which the light emission spectrum exhibits a mountain shape. That is, the local maximum value shows a maximum value in a mountain shape that rises and falls. Further, the term "local minimum value of light-emission intensity" (hereunder, referred to simply as "local minimum value") shows a minimum value of a portion at which the light emission spectrum exhibits a valley shape. That is, the local minimum value is a minimum value in a valley shape that falls and rises. Consequently, a value in the case of a portion that continues rising in a gently-sloping manner (including a parallel manner), that is, a portion which includes no falling portion, is not referred to as a local maximum value. Further, a value in the case of a portion that continues falling in a gently-sloping manner (including a parallel manner), that is, a portion which includes no rising portion, is not referred to as a local minimum value.

A feature according to the present invention is that, when a peak height of an arbitrary local maximum value is taken as 1, with regard to a local minimum value that is closest on a long wavelength side of the local maximum value, a ratio between the local maximum value and the local minimum value (peak height of local minimum value/peak height of local maximum value) is 0.5 or more. By making the intensity ratio between an arbitrary local maximum value and a local minimum value that is closest thereto on a long wavelength side thereof as large as 0.5 or more, that is, by reducing bumps and dips in the light emission spectrum, it is possible to eliminate the occurrence of insufficient wavelength regions in the visible light region, and make the appearance of the color of an object equivalent to that in the case of irradiation by sunlight (natural light).

Further, according to the present invention, an intensity ratio is defined with respect to a portion at which a local maximum value and a local minimum value are closest to each other in a light emission spectrum, and an intensity ratio is not limited with regard to a portion at which even though there is a local maximum value there is no local minimum value that is closest thereto on a long wavelength side. In other words, this means that all intensity ratios (local minimum value/local maximum value) are 0.5 or more with respect to portions at which there is a local maximum value and there is a local minimum value that is closest thereto in the light emission spectrum.

From the viewpoint of reducing bumps and dips in the light emission spectrum, it is preferable that with respect to an arbitrary local maximum value of light-emission intensity between 350 and 780 nm of a light emission spectrum of the white light source, a ratio of a local minimum value of light-emission intensity that is closest on a long wavelength side to the local maximum value is such that, when the local maximum value is taken as 1, the local minimum value is 0.7 or more. Note that although a limit of the ratio between a local maximum value and a local minimum value that is closest thereto on the long wavelength side is 1, a limit of 0.95 or less is preferable in consideration of manufacturability.

Figure 3:
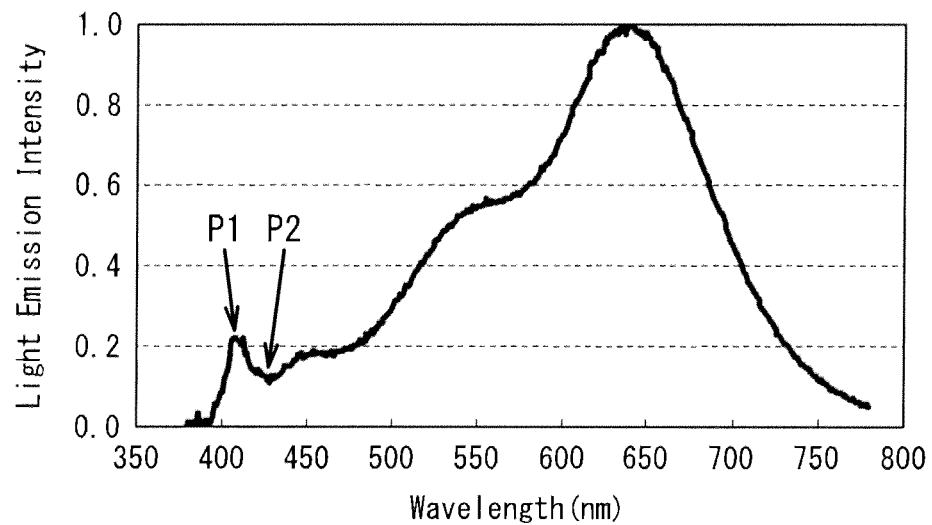
FIG. 3 is a graph showing a light emission spectrum of a white light source according to Example 1.

An example of measurement of a local maximum value and a local minimum value will now be described using FIG. 3. FIG. 3 is a view illustrating a light emission spectrum according to Example 1 that is described later. In FIG. 3, the maximum peak intensity is present at a wavelength of 635 nm. Further, the only portion having a local maximum value and a local minimum value that is closest thereto on the long wavelength side thereof is a portion including a local maximum value P1 (409 nm) and a local minimum value P2 (429 nm). An intensity ratio between the local maximum value P1 and the local minimum value P2 is 0.54 (=intensity 0.12 of the local minimum value P2/intensity 0.22 of the local maximum value P1).

Further, it is preferable that the color temperature of the white light is between 2,500 and 7,000 K. If this color temperature falls below 2,500 K or exceeds 7,000 K, a color temperature that does not exist in sunlight may be unfavorably produced. The preferable range of the color temperature is 2,700 to 6,700 K. It is possible to adjust the color temperature by means of the mixing ratio of the phosphors of the respective colors. The color temperature is calculated from the light emission spectrum. Note that the unit of the color temperature is kelvin (K).

Further, it is preferable that the maximum peak intensity is within a range of 491 to 780 m. If the maximum peak intensity is within the range of 491 to 780 m, it means that there is no maximum peak in a region ranging from 350 to 490 nm. It has been reported in recent research that blue light causes Asian (including Japanese) and European people to feel a relatively dazzling sensation. It has also been reported that prolonged exposure to blue light results into adverse influences on the human body. For example, problems include retinopathy and sleeping disorders caused by suppression of melatonin secretion. Further, several adverse effects on humans have been similarly reported with respect to prolonged exposure to ultraviolet light. Therefore, adverse effects on humans can be suppressed when there is no maximum peak in a region ranging from an ultraviolet to blue region.

It is desirable that there are as few light emission components of an ultraviolet to blue region as possible, and specifically it is desirable that such light emission components are of the same level as components of blue light and the like that are included in the spectrum of black-body radiation. The reason is that humans lived for many years under sunlight as well as light from flames. Artificial light has only been adopted into human life for at most 100-odd years, and the light that humans have become familiarized with is sunlight. Accordingly, the most desirable light for human health is sunlight, and the continuous spectrum of black-body radiation that corresponds to sunlight is also desirable for artificial light sources.

A desirable intensity with respect to light emission components of an ultraviolet to blue region according to the present invention is defined hereunder. According to the white light source of the present invention, with respect to a black-body radiation spectrum having the same color temperature as that of the white light source, in a case where the black-body radiation spectrum when a visual luminance is made identical to that of the white light source is compared with the light emission spectrum of the white light source, the maximum light emission intensity of the light emission spectrum of a violet to blue region (380 to 490 nm) of the white light source is an intensity that is less than or equal to 1.5 times the light emission intensity of the black-body radiation spectrum at the same wavelength as the wavelength exhibiting the maximum light emission intensity.

When the intensity ratio is 1.5 or less, the spectral distribution of the white light source can be regarded as being close to that of sunlight, and humans do not feel discomfort from this light source. Note that, although the smaller that the value of the intensity ratio is the better, if the value is extremely small a problem will arise that a blue component of the light source will excessively decrease and the appearance of the object will become unnatural. Therefore, it is desirable that blue light of a certain intensity or more is also included, and thus a more desirable range of the intensity ratio is from 0.8 to 1.2.

Although the material of each phosphor is not particularly limited as long as the material emits visible light upon excitation by light emitted from a light emitting diode, it is preferable that a peak wavelength of each phosphor is in a range of 420 to 700 nm.

Further, it is preferable that the white light source includes three or more types, or furthermore, four or more types of phosphors each having different light emission peak wavelengths. In particular, when a light emission peak of the light emitting diode is in a range of 350 to 420 nm, it is preferable to use four or more types of phosphor having different peak wavelengths. Further, when a light emission peak of the light emitting diode is in a range of 421 to 490 nm, it is preferable to use three or more types of phosphor having different peak wavelengths. With respect to the phosphors, it is preferable to select phosphors of three or more types, or furthermore, four or more types from among blue phosphor, green phosphor, yellow phosphor and red phosphor.

Further, it is preferable that the white light source includes a phosphor for which the half-value width of the light emission spectrum is 50 nm or more. By using a phosphor having a broad light emission spectrum such that the half-value width of the light emission spectrum is 50 nm or more, it is easy to adjust the intensity ratio (local minimum value/local maximum value) between the local maximum value and local minimum value that are closest on the long wavelength side to 0.5 or more. Further, when using three or more types of phosphor having different peak wavelengths, although it is sufficient if a half-value width of the light emission spectrum of at least one type of phosphor is 50 nm or more, it is more preferable that the half-value width of two types, or furthermore, all three types of phosphor is 50 nm or more. It is also preferable that the limit of the half-value width is 100 nm or less.

Further, it preferable that there are at least one or more regions at which the light emission spectrums of the light emitting diode and the three or more types of phosphor having different light emission peak wavelengths overlap. In order to make a ratio between a local maximum value and a local minimum value (local minimum value/local maximum value) that are closest on the long wavelength side of the light emission spectrum of the white light source 0.5 or more, it is effective not to form a light emission intensity region that protrudes by itself in a visible light region, particularly in a region from 420 to 700 nm. To achieve this, it is preferable that among the light emission of the light emitting diode and the respective light emissions of the three or more types of phosphors having different peak wavelengths, that is, among the four light emission spectrums, there is at least one region at which the light emission spectrums overlap. Further, it is preferable that the number of regions at which the light emission spectrums overlap is two or as high as three regions.

Although the material for constituting each phosphor is not particularly limited, the following materials may be mentioned as materials that satisfy the foregoing conditions.

Specific examples of the blue phosphor (B) may include a europium-activated alkaline-earth phosphate phosphor (a peak wavelength of 440 to 455 nm) and a europium-activated barium magnesium aluminate phosphor (a peak wavelength of 450 to 460 nm).

Specific examples of the blue-green phosphor (BG) may include a europium-activated strontium aluminate phosphor (a peak wavelength of 480 to 500 nm) and a europium- and manganese-activated barium magnesium aluminate phosphor (a peak wavelength of 510 to 520 nm).

Specific examples of the green phosphor (G) may include a europium-activated orthosilicate phosphor (a peak wavelength of 520 to 550 nm), a europium-activated β-sialon phosphor (a peak wavelength of 535 to 545 nm), and a europium-activated strontium sialon phosphor (a peak wavelength of 510 to 530 nm).

Specific examples of the yellow phosphor (Y) may include a europium-activated orthosilicate phosphor (a peak wavelength of 550 to 580 nm) and a cerium-activated rare-earth aluminum garnet phosphor (a peak wavelength of 550 to 580 nm).

Specific examples of the red phosphor (R) may include a europium-activated strontium sialon phosphor (a peak wavelength of 600 to 650 nm), a europium-activated calcium strontium nitride phosphor (a peak wavelength of 610 to 650 nm), a europium-activated lanthanum oxysulfide phosphor (a peak wavelength of 620 to 630 nm), a manganese-activated magnesium fluorogermanate (a peak wavelength of 640 to 660 nm), and a europium-activated alkaline-earth nitride phosphor (a peak wavelength of 600 to 650 nm).

It is preferable that the average particle size of the phosphors is between 1 and 100 μm, and more preferably 5 and 50 When using three or more types of phosphors having different peak wavelength, since it is necessary to uniformly mix the respective phosphors, it is necessary that the average particle size is between 1 and 100 μm, and furthermore, it preferable that the average particle size is in a range of 5 to 50 μm.

Figure 12:
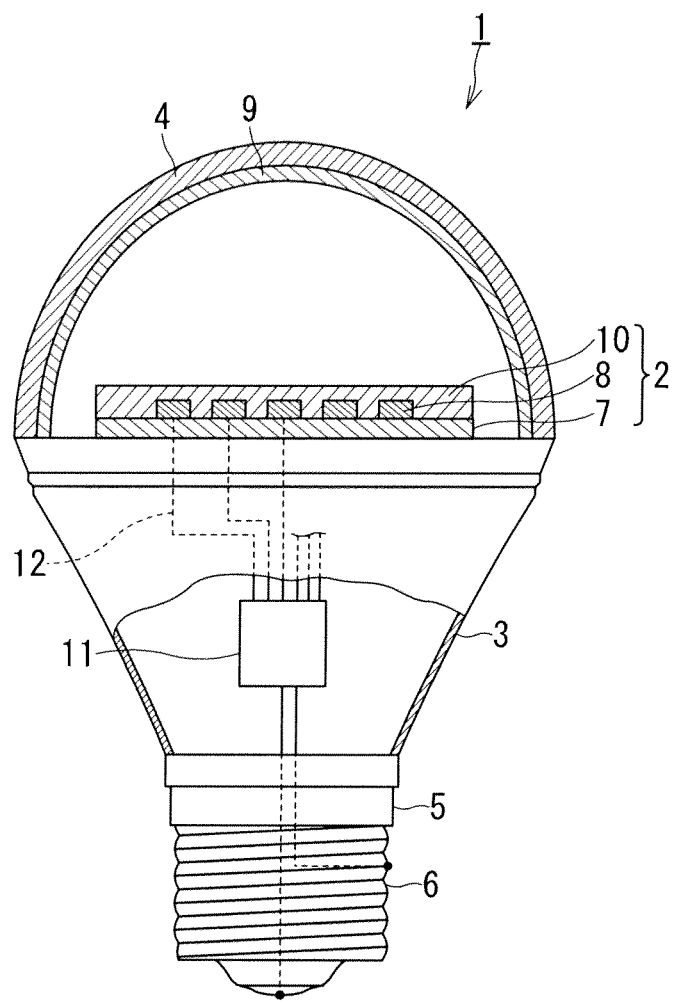
FIG. 12 is a cross sectional view illustrating one example of the configuration of the white light source according to the present invention.

Next, a structure of the white light source will be explained. FIG. 12 illustrates a bulb-type white light source as an example of one embodiment of the white light source according to the present invention. In FIG. 12, a reference numeral 1 denotes an LED bulb (white light source), reference numeral 2 denotes an LED module, reference numeral 3 denotes a base body, reference numeral 4 denotes a globe, reference numeral 5 denotes an insulating member, reference numeral 6 denotes a cap, reference numeral 7 denotes a substrate, reference numeral 8 denotes LED chips, reference numeral 9 denotes a phosphor layer, and reference numeral 10 denotes a transparent resin layer. FIG. 12 illustrates an example of a structure in which a space is provided between a phosphor layer and a light emitting diode.

That is, the LED bulb 1 illustrated in FIG. 12 includes: the LED module 2; the base body 3 to which the LED module 2 is set; the globe 4 that is attached to an upper portion of the base body 3 so as to cover the LED module 2; the cap 6 that is attached to a lower end part of the base body 3 with the intermediation of the insulating member 5; and a lighting circuit 11 provided inside of the base body 3.

The LED module 2 includes the LED chips 8 that emit light having a light emission peak wavelength between 350 and 490 nm that are mounted on the substrate 7. The plurality of LED chips 8 are surface-mounted on the substrate 7. For example, InGaN-based, GaN-based, and AlGaN-based light emitting diodes are used for the LED chips 8. A wiring network (not illustrated) is provided on a surface of the substrate 7 (further provided inside thereof as needed), and an electrode of each LED chip 8 is electrically connected to the wiring network of the substrate 7. Wiring lines 12 are drawn from a side surface or a bottom surface of the LED module 2, and the wiring lines 12 are electrically connected to the lighting circuit 11 provided inside the base body 3. The LED chips 8 are turned on by DC voltage applied via the lighting circuit 11.

The phosphor layer 9 that absorbs light emitted from the LED chips 8 and emits white light is provided on an inner surface of the globe 4. The phosphor layer 9 is formed by combining, as needed, three or more types, and furthermore, four or more types of phosphor having different peak wavelengths. Further, the phosphor layer 9 is formed by mixing the phosphors with a resin. Further, all the phosphors may be mixed to form a mixed phosphor layer. Alternatively, phosphor layers formed by mixing about one to three types of phosphor are laminated to form a multi-layer phosphor layer.

Although FIG. 12 illustrates a structure in which the phosphor layer is provided on the inner surface of the globe 4, the phosphor layer may be provided on an outer surface of the globe 4, or the phosphors may be mixed in the resin-made globe 4 itself. Further, the white light source according to the present invention is not limited to the above described bulb types, and the white light source can also be applied to a fluorescent light type (elongated type), a chandelier type, and the like, and the shape thereof is not limited.

Figure 13:
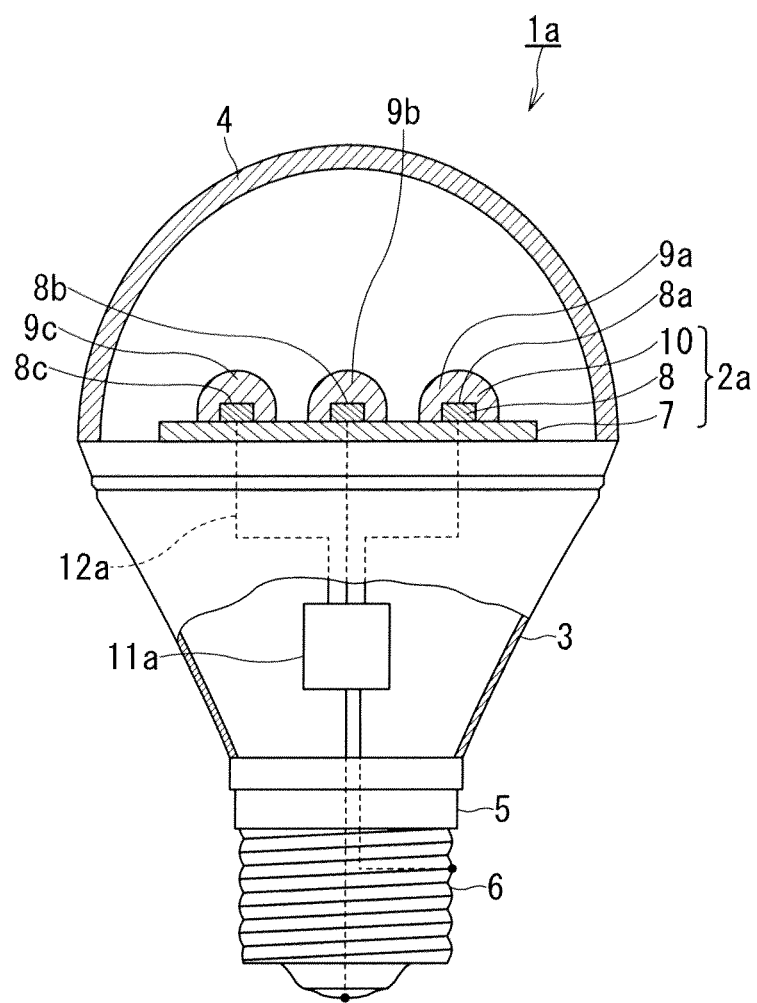
FIG. 13 is a cross sectional view illustrating another example of the configuration of the white light source according to the present invention.

Further, as illustrated in FIG. 13, an LED chip 8a and a phosphor layer 9a, an LED chip 8b and a phosphor layer 9b, and an LED chip 8c and a phosphor layer 9c may be placed together on a common substrate 7. Then, the LED chips 8a, 8b, and 8c may be housed in the same globe 4, whereby a white light source system 1a may be configured. Further, a transparent resin layer may be provided between the LED chip 8 and the phosphor layer 9.

The LED chips 8a, 8b, and 8c are each connected to a lighting circuit 11a by a wiring line 12a. A user can select an LED chip to be turned on by means of a switching mechanism (not illustrated) contained inside the lighting circuit 11a, as needed. Further, the white light source according to the present invention can be applied to a structure in which a phosphor layer is provided on a light emitting diode, and also to a structure in which a phosphor layer is provided on a light emitting diode with the intermediation of a transparent resin layer. It is preferable that the thickness of the transparent resin layer is in a range of 0.01 to 0.1 mm. Although FIG. 13 illustrates a structure in which a single phosphor layer is provided on a single LED chip (a one-chip type white light source), a structure may also be adopted in which a phosphor layer covers a plurality of LED chips (a multi-chip type white light source). Further, in the case of each of a bulb-type, a one-chip type, and a multi-chip type, it is preferable that the thickness of the phosphor layer is in a range of 0.01 to 3 mm. Furthermore, a plurality of white light sources may also be arranged to form a unit and used as a white light source system.

The above described white light source according to the present invention is effective as a white light source that is used for task illumination. In general, illumination for illuminating a wide area such as an entire room is defined as ambient illumination, and illumination for illuminating a comparatively narrow area such as around the hands of a worker when performing office work such as operating a personal computer is defined as task illumination. In the case of office work, the recommended level of illuminance according to JIS-Z-9110 is between around 500 to 750 lux.

In the case of office work, because a case where work is performed for a long time may also be assumed, if a white light source is used in which a specific wavelength protrudes (a ratio between a local maximum value and a local minimum value closest thereto on the long wavelength side thereof is less than 0.5), it imposes a burden on the worker's eyes. On the other hand, by controlling the ratio between a local maximum value and a local minimum value closest thereto on the long wavelength side thereof so as to be 0.5 or more as in the present invention, it is possible to suppress the imposition of a burden on the worker's eyes since colors of an object are perceived that are equivalent to a time of illuminating the object with sunlight (natural light).

The white light source is also effective for use in illumination for illuminating any one or more kinds among printed matter, foodstuff, and a human. The term "printed matter" refers to newspapers and magazines and the like. The term "foodstuff" includes all kinds of food and beverages. The term "human" refers mainly to the human face. With the white light source according to the present invention, since the relevant object is seen with color tones equivalent to those at a time of illumination with sunlight, a burden that is imposed on the eyes when reading printed matter for an extended period can be suppressed, and color tones of foodstuff and humans can be perceived that are equivalent to those at a time of illumination with sunlight.

In addition, the white light source is effective for illumination in a case where a distance from an object of irradiation (physical object) is 1.5 m or less. In the case of a desk lamp that illuminates the area around the hands of a worker when performing office work, as in the case of the aforementioned task illumination, or when illuminating clothes or foodstuff or the like, the color tones of an object can be perceived with color tones that are equivalent to those in a case where the object is illuminated with sunlight. Further, since control is performed so that the white light source does not have a light emission spectrum in which a specific wavelength protrudes, even if the distance from the object of irradiation is 1.5 m or less, or even approaches a distance of 1 m or less, the burden imposed on the eyes can be suppressed.

Although effective usages of the white light source of the present invention are described above, the present invention is not limited thereto, and it is possible to use the white light source for various kinds of illumination.

EXAMPLES

Example 1

LED chips each having a light emission peak wavelength of 400 nm were prepared. Next, there was prepared a mixture including: a europium-activated alkaline-earth phosphate blue phosphor having a peak wavelength of 445 nm; a europium-activated strontium aluminate blue-green phosphor having a peak wavelength of 490 nm; a europium-activated orthosilicate green phosphor having a peak wavelength of 530 nm; a europium-activated orthosilicate yellow phosphor having a peak wavelength of 555 nm; and a europium-activated strontium sialon red phosphor having a peak wavelength of 630 nm, as phosphors that emitted light while being irradiated with electromagnetic waves of 400 nm.

The average particle size of the phosphors was set to 18 μm. The phosphors were mixed at a ratio by weight (ratio by mass) of blue phosphor:blue-green phosphor:green phosphor:yellow phosphor:red phosphor=5:10:15:20:50, the resulting mixture was then mixed with a transparent resin (silicone resin), and was applied to the globe inner surface, whereby the bulb-type white light source illustrated in FIG. 12 was manufactured. The correlated color temperature of light emission color of the obtained white light source was 2,800 K.

Note that phosphors for which a half-value width of the light emission spectrum was 50 nm or more were the blue-green phosphor, the green phosphor, the yellow phosphor, and the red phosphor. Further, with respect to the light emission spectrums of the blue phosphor, the blue-green phosphor, the green phosphor, the yellow phosphor, and the red phosphor, there was an overlapping portion in the light emission spectrums of the phosphors whose respective peak wavelengths were adjacent. The thickness of the phosphor layer was set to 0.4 mm.

Next, FIG. 3 shows a result obtained by measuring the light emission spectrum of the bulb-type white light source in Example 1 according to total luminous flux measurement using an integrating sphere in conformity with JIS-C-8152. As is apparent from FIG. 3, ratios (local minimum value/ local maximum value) between a local maximum value P1 and a local minimum value P2 that were adjacent on the long wavelength side were each 0.5 or more.

Example 2

LED chips each having a light emission peak wavelength of 400 nm were prepared. Next, there was prepared a mixture including: a europium-activated alkaline-earth phosphate blue phosphor having a peak wavelength of 445 nm; a europium-activated strontium aluminate blue-green phosphor having a peak wavelength of 490 nm; a europium-activated β-sialon green phosphor having a peak wavelength of 540 nm; a europium-activated orthosilicate yellow phosphor having a peak wavelength of 555 nm; and a europium-activated strontium sialon red phosphor having a peak wavelength of 630 nm, as phosphors that emitted light while being irradiated with electromagnetic waves of 400 nm.

The average particle size of the phosphors was set to 13 µm. The phosphors were mixed at a ratio by weight (ratio by mass) of blue phosphor:blue-green phosphor:green phosphor:yellow phosphor:red phosphor=10:5:15:20:50, the resulting mixture was then mixed with a transparent resin (silicone resin), and was applied to the globe inner surface, whereby the bulb-type white light source illustrated in FIG. 12 was manufactured. The correlated color temperature of light emission color of the obtained white light source was 2,800 K.

Note that phosphors for which a half-value width of the light emission spectrum was 50 nm or more were the blue-green phosphor, the green phosphor, the yellow phosphor, and the red phosphor. Further, with respect to the light emission spectrums of the blue phosphor, the blue-green phosphor, the green phosphor, the yellow phosphor, and the red phosphor, there was an overlapping portion in the light emission spectrums of the phosphors whose respective peak wavelengths were adjacent. The thickness of the phosphor layer was set to 0.2 mm.

Figure 4:
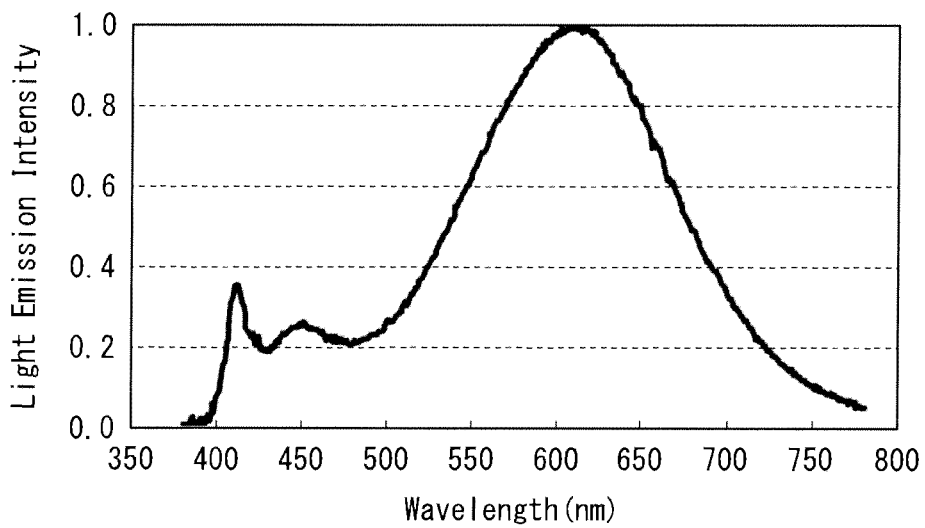
FIG. 4 is a graph showing a light emission spectrum of a white light source according to Example 2.

Similarly to Example 1, the light emission spectrum of the white light source according to Example 2 was checked according to total luminous flux measurement using an integrating sphere. FIG. 4 shows the result thereof. As is apparent from FIG. 4, ratios (local minimum value/local maximum value) between a local maximum value and a local minimum value that were adjacent on the long wavelength side were each 0.5 or more.

Example 3

LED chips each having a light emission peak wavelength of 400 nm were prepared. There was prepared a mixture including: a europium-activated alkaline-earth phosphate blue phosphor having a peak wavelength of 445 nm; a europium-activated strontium aluminate blue-green phosphor having a peak wavelength of 490 nm; a europium-activated orthosilicate green phosphor having a peak wavelength of 530 nm; a europium-activated orthosilicate yellow phosphor having a peak wavelength of 555 nm; and a europium-activated alkaline-earth nitride red phosphor having a peak wavelength of 635 nm, as the phosphors that emitted light while being irradiated with electromagnetic waves of 400 nm. The average particle size of the phosphors was set to 28 µm.

The phosphors were mixed at a ratio by weight (ratio by mass) of blue phosphor:blue-green phosphor:green phosphor:yellow phosphor:red phosphor=5:5:15:25:50, the resulting mixture was then mixed with a transparent resin (silicone resin), and was applied to the globe inner surface, whereby the bulb-type white light source illustrated in FIG. 12 was manufactured. The correlated color temperature of light emission color of the obtained white light source was 2,700 K.

Note that phosphors for which a half-value width of the light emission spectrum was 50 nm or more were the blue-green phosphor, the green phosphor, the yellow phosphor, and the red phosphor. Further, with respect to the light emission spectrums of the blue phosphor, the blue-green phosphor, the green phosphor, the yellow phosphor, and the red phosphor, there was an overlapping portion in the light emission spectrums of the phosphors whose respective peak wavelengths were adjacent. The thickness of the phosphor layer was set to 1.0 mm.

Figure 5:
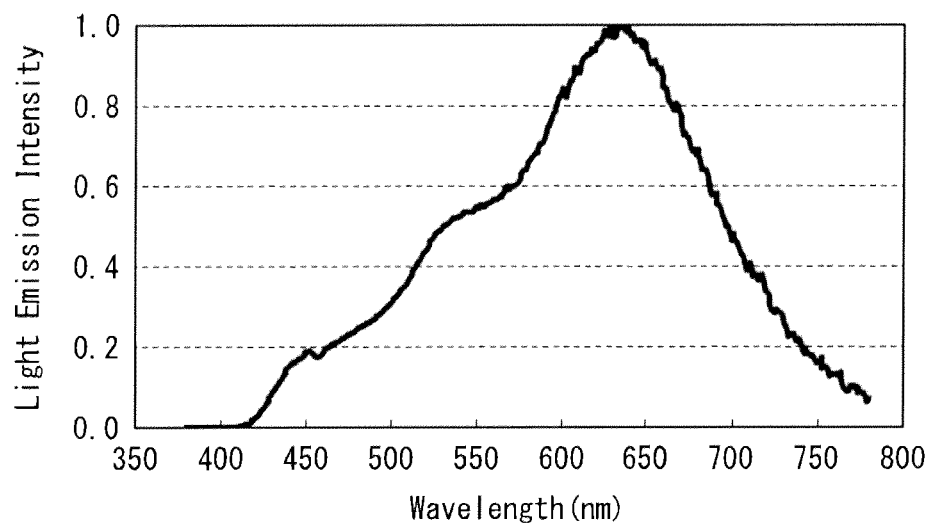
FIG. 5 is a graph showing a light emission spectrum of a white light source according to Example 3.

Next, similarly to Example 1, the light emission spectrum of the white light source according to Example 3 was checked according to total luminous flux measurement using an integrating sphere. FIG. 5 shows the result thereof. As is apparent from FIG. 5, local maximum values and local minimum values that varied significantly were not observed, and ratios (local minimum value/local maximum value) between a local maximum value and a local minimum value that were adjacent on the long wavelength side were each 0.5 or more.

Example 4

LED chips each having a light emission peak wavelength of 400 nm were prepared. Next, there was prepared a mixture including: a europium-activated alkaline-earth phosphate blue phosphor having a peak wavelength of 445 nm; a europium-activated strontium aluminate blue-green phosphor having a peak wavelength of 490 nm; a europium-activated orthosilicate green phosphor having a peak wavelength of 530 nm; a europium-activated orthosilicate yellow phosphor having a peak wavelength of 555 nm; and a europium-activated strontium sialon red phosphor having a peak wavelength of 630 nm, as phosphors that emitted light while being irradiated with electromagnetic waves of 400 nm.

The average particle size of the phosphors was set to 18 µm. The phosphors were mixed at a ratio by weight (ratio by mass) of blue phosphor:blue-green phosphor green phosphor:yellow phosphor:red phosphor=10:15:25:20:50, the resulting mixture was then mixed with a transparent resin (silicone resin), and was applied to the globe inner surface, whereby the bulb-type white light source illustrated in FIG. 12 was manufactured. The correlated color temperature of light emission color of the obtained white light source was 3,800 K.

Note that phosphors for which a half-value width of the light emission spectrum was 50 nm or more were the blue-green phosphor, the green phosphor, the yellow phosphor, and the red phosphor. Further, with respect to the light emission spectrums of the blue phosphor, the blue-green phosphor, the green phosphor, the yellow phosphor, and the red phosphor, there was an overlapping portion in the light emission spectrums of the phosphors whose respective peak wavelengths were adjacent. The thickness of the phosphor layer was set to 0.5 mm.

Figure 6:
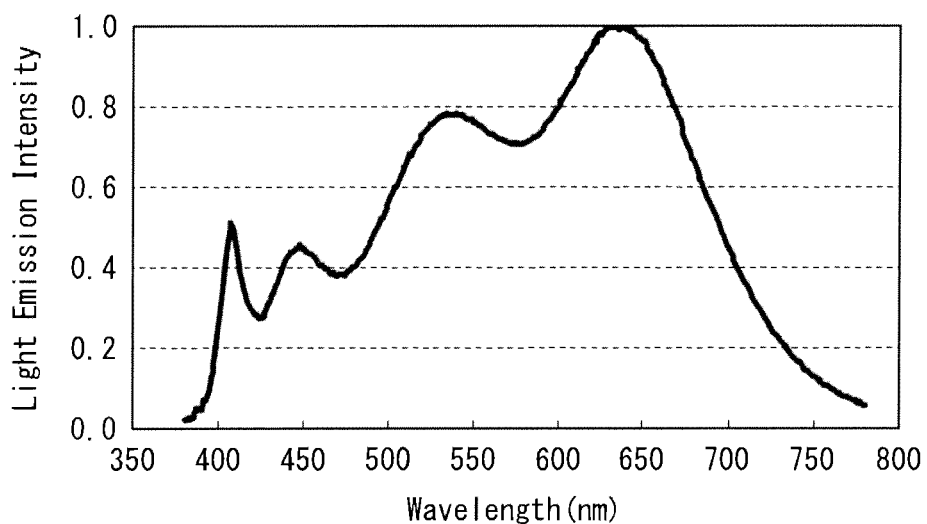
FIG. 6 is a graph showing a light emission spectrum of a white light source according to Example 4.

Next, similarly to Example 1, the light emission spectrum of the white light source according to Example 4 was checked according to total luminous flux measurement using an integrating sphere. FIG. 6 shows the result thereof. As is apparent from FIG. 6, ratios (local minimum value/local maximum value) between a local maximum value and a local minimum value that were adjacent on the long wavelength side were each 0.5 or more.

Example 5

LED chips each having a light emission peak wavelength of 400 nm were prepared. Next, there was prepared a mixture including: a europium-activated alkaline-earth phosphate blue phosphor having a peak wavelength of 445 nm; a europium-activated strontium aluminate blue-green phosphor having a peak wavelength of 490 nm; a europium-activated β-sialon green phosphor having a peak wavelength of 540 nm; a europium-activated orthosilicate yellow phosphor having a peak wavelength of 555 nm; and a europium-activated strontium sialon red phosphor having a peak wavelength of 630 nm, as phosphors that emitted light while being irradiated with electromagnetic waves of 400 nm.

The average particle size of the phosphors was set to 10 μm. The phosphors were mixed at a ratio by weight (ratio by mass) of blue phosphor:blue-green phosphor:green phosphor:yellow phosphor:red phosphor=10:15:20:25:30, the resulting mixture was then mixed with a transparent resin (silicone resin), and a phosphor layer was formed directly on the light emitting diode. Example 5 is a one-chip type white light source. The thickness of the phosphor layer was set to 0.3 mm. The correlated color temperature of light emission color of the obtained white light source was 4,200 K.

Note that phosphors for which a half-value width of the light emission spectrum was 50 nm or more were the blue-green phosphor, the green phosphor, the yellow phosphor, and the red phosphor. Further, with respect to the light emission spectrums of the blue phosphor, the blue-green phosphor, the green phosphor, the yellow phosphor, and the red phosphor, there was an overlapping portion in the light emission spectrums of the phosphors whose respective peak wavelengths were adjacent.

Figure 7:
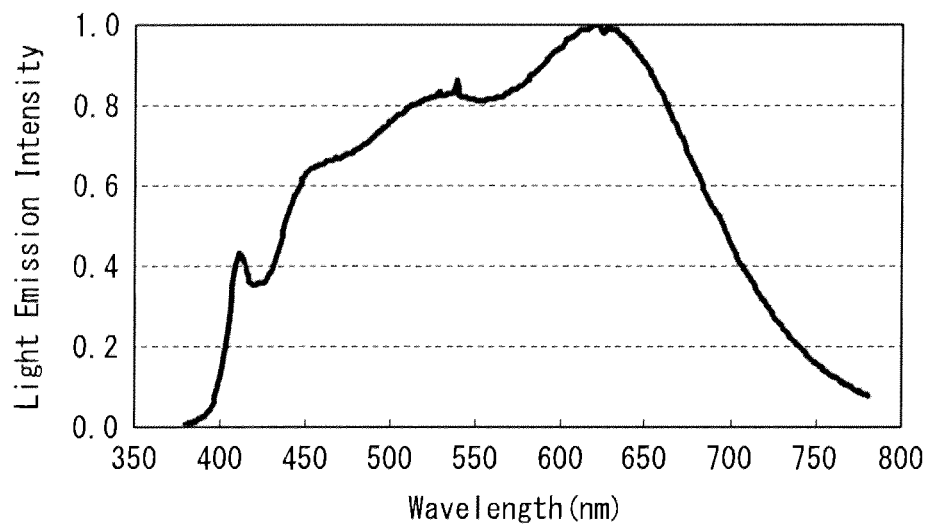
FIG. 7 is a graph showing a light emission spectrum of a white light source according to Example 5.

FIG. 7 illustrates the result obtained when the light emission spectrum of the white light source of Example 5 was checked. As is apparent from FIG. 7, ratios (local minimum value/local maximum value) between a local maximum value and a local minimum value that were adjacent on the long wavelength side were each 0.5 or more.

Example 6

LED chips each having a light emission peak wavelength of 400 nm were prepared. Next, there was prepared a mixture including: a europium-activated alkaline-earth phosphate blue phosphor having a peak wavelength of 445 nm; a europium-activated strontium aluminate blue-green phosphor having a peak wavelength of 490 nm; a europium-activated β-sialon green phosphor having a peak wavelength of 540 nm; a europium-activated orthosilicate yellow phosphor having a peak wavelength of 555 nm; and a europium-activated strontium sialon red phosphor having a peak wavelength of 630 nm, as phosphors that emitted light while being irradiated with electromagnetic waves of 400 nm.

The average particle size of the phosphors was set to 10 μm. The phosphors were mixed at a ratio by weight (ratio by mass) of blue phosphor:blue-green phosphor:green phosphor:yellow phosphor:red phosphor=30:15:20:15:20, the resulting mixture was then mixed with a transparent resin (silicone resin), and a phosphor layer was formed directly on the light emitting diode. Example 6 is a one-chip type white light source. The thickness of the phosphor layer was set to 0.3 mm. The correlated color temperature of light emission color of the obtained white light source was 5,000 K.

Note that phosphors for which a half-value width of the light emission spectrum was 50 nm or more were the blue-green phosphor, the green phosphor, the yellow phosphor, and the red phosphor. Further, with respect to the light emission spectrums of the blue phosphor, the blue-green phosphor, the green phosphor, the yellow phosphor, and the red phosphor, there was an overlapping portion in the light emission spectrums of the phosphors whose respective peak wavelengths were adjacent.

Figure 8:
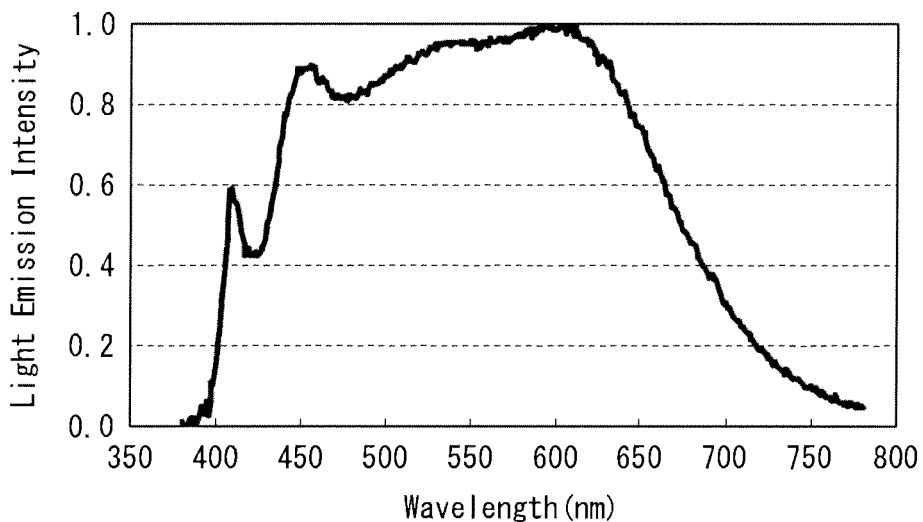
FIG. 8 is a graph showing a light emission spectrum of a white light source according to Example 6.

FIG. 8 illustrates the result obtained when the light emission spectrum of the white light source of Example 6 was checked. As is apparent from FIG. 8, ratios (local minimum value/local maximum value) between a local maximum value and a local minimum value that were adjacent on the long wavelength side were each 0.5 or more.

Example 7

LED chips each having a light emission peak wavelength of 400 nm were prepared. Next, there was prepared a mixture including: a europium-activated alkaline-earth phosphate blue phosphor having a peak wavelength of 445 nm; a europium-activated strontium aluminate blue-green phosphor having a peak wavelength of 490 nm; a europium-activated β-sialon green phosphor having a peak wavelength of 540 nm; a europium-activated orthosilicate yellow phosphor having a peak wavelength of 555 nm; and a europium-activated strontium sialon red phosphor having a peak wavelength of 630 nm, as phosphors that emitted light while being irradiated with electromagnetic waves of 400 nm.

The average particle size of the phosphors was set to 13 μm. The phosphors were mixed at a ratio by weight (ratio by mass) of blue phosphor:blue-green phosphor:green phosphor:yellow phosphor:red phosphor=30:15:15:20:20, the resulting mixture was then mixed with a transparent resin (silicone resin), and was applied to the globe inner surface, whereby the bulb-type white light source illustrated in FIG. 12 was manufactured. The correlated color temperature of light emission color of the obtained white light source was 5,000 K.

Note that phosphors for which a half-value width of the light emission spectrum was 50 nm or more were the blue-green phosphor, the green phosphor, the yellow phosphor, and the red phosphor. Further, with respect to the light emission spectrums of the blue phosphor, the blue-green phosphor, the green phosphor, the yellow phosphor, and the red phosphor, there was an overlapping portion in the light emission spectrums of the phosphors whose respective peak wavelengths were adjacent. The thickness of the phosphor layer was set to 0.2 mm.

Figure 9:
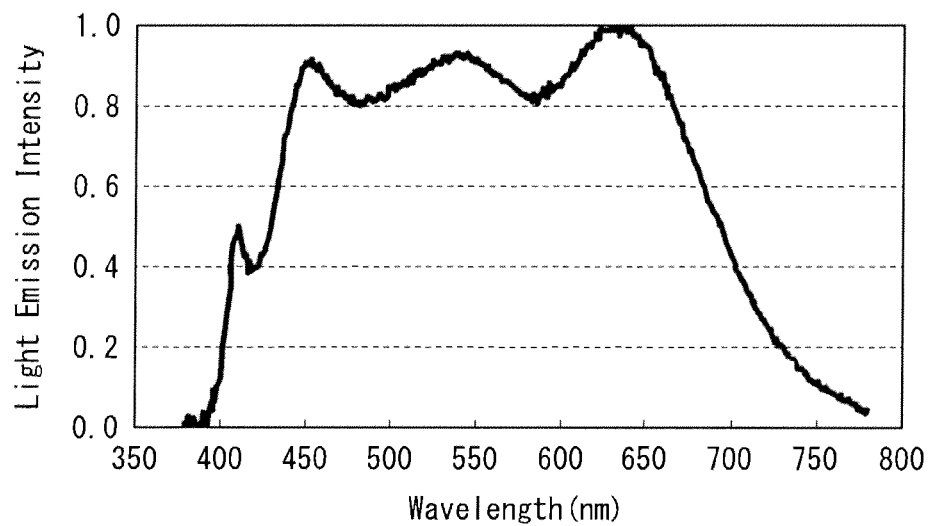
FIG. 9 is a graph showing a light emission spectrum of a white light source according to Example 7.

Similarly to Example 1, the light emission spectrum of the white light source according to Example 7 was checked according to total luminous flux measurement using an integrating sphere. FIG. 9 shows the result thereof. As is apparent from FIG. 9, ratios (local minimum value/local maximum value) between a local maximum value and a local minimum value that were adjacent on the long wavelength side were each 0.5 or more.

Example 8

A blue light emitting LED having a light emission peak wavelength of 445 nm was prepared as an LED chip. Next, there was prepared a mixture including: a europium-activated orthosilicate green phosphor having a peak wavelength of 530 nm; a europium-activated orthosilicate yellow phosphor having a peak wavelength of 530 nm; and a europium-activated strontium sialon red phosphor having a peak wavelength of 630 nm, as phosphors that emitted light while being irradiated with electromagnetic waves of 445 nm.

The average particle size of the phosphors was set to 17 μm. The phosphors were mixed at a ratio by weight (ratio by mass) of green phosphor:yellow phosphor:red phosphor=20:30:50, the resulting mixture was then mixed with a transparent resin (silicone resin), and was applied to the globe inner surface, whereby the bulb-type white light source illustrated in FIG. 12 was manufactured. The correlated color temperature of light emission color of the obtained white light source was 2,700 K. The thickness of the phosphor layer was set to 0.5 mm.

Note that phosphors for which a half-value width of the light emission spectrum was 50 nm or more were the green phosphor, the yellow phosphor, and the red phosphor. Further, with respect to the light emission spectrums of the green phosphor, the yellow phosphor, and the red phosphor, there was an overlapping portion in the light emission spectrums of the phosphors whose respective peak wavelengths were adjacent.

Figure 10:
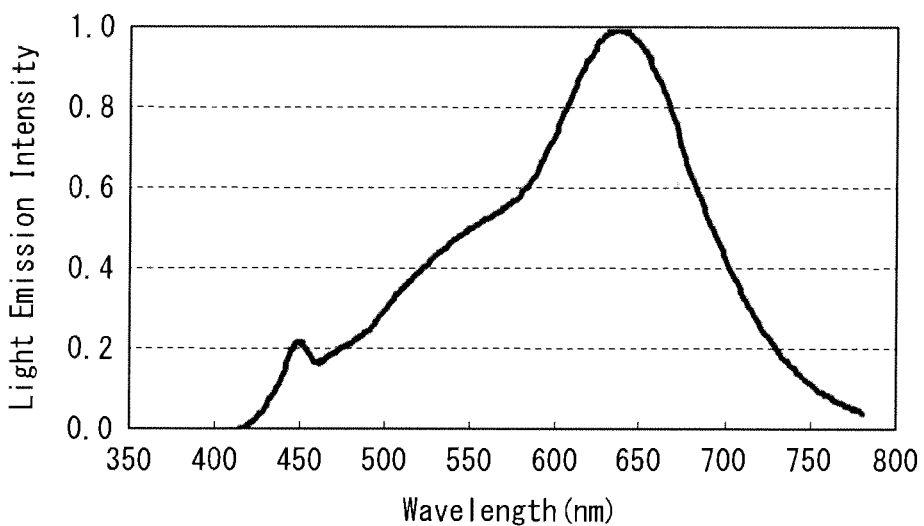
FIG. 10 is a graph showing a light emission spectrum of a white light source according to Example 8.

Similarly to Example 1, the light emission spectrum of the white light source according to Example 8 was checked according to total luminous flux measurement using an integrating sphere. FIG. 10 shows the result thereof. As is apparent from FIG. 10, ratios (local minimum value/local maximum value) between a local maximum value and a local minimum value that were adjacent on the long wavelength side were each 0.5 or more.

Example 9

A blue light emitting LED having a light emission peak wavelength of 445 nm was prepared as an LED chip. Next, there was prepared a mixture including: a europium-activated orthosilicate green phosphor having a peak wavelength of 530 nm; a europium-activated orthosilicate yellow phosphor having a peak wavelength of 530 nm; and a europium-activated strontium sialon red phosphor having a peak wavelength of 630 nm, as phosphors that emitted light while being irradiated with electromagnetic waves of 445 nm.

The average particle size of the phosphors was set to 15 μm. The phosphors were mixed at a ratio by weight (ratio by mass) of green phosphor:yellow phosphor:red phosphor=30:40:30, the resulting mixture was then mixed with a transparent resin (silicone resin), and was applied to the globe inner surface, whereby the bulb-type white light source illustrated in FIG. 12 was manufactured. The correlated color temperature of light emission color of the obtained white light source was 2,700 K. The thickness of the phosphor layer was set to 0.4 mm.

Note that phosphors for which a half-value width of the light emission spectrum was 50 nm or more were the green phosphor, the yellow phosphor, and the red phosphor. Further, with respect to the light emission spectrums of the green phosphor, the yellow phosphor, and the red phosphor, there was an overlapping portion in the light emission spectrums of the phosphors whose respective peak wavelengths were adjacent.

Figure 11:
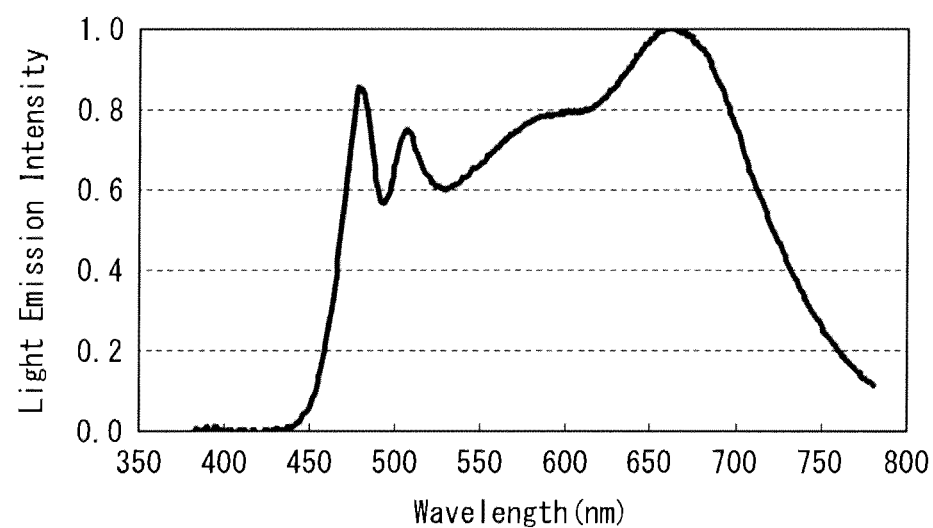
FIG. 11 is a graph showing a light emission spectrum of a white light source according to Example 9.

Similarly to Example 1, the light emission spectrum of the white light source according to Example 9 was checked according to total luminous flux measurement using an integrating sphere. FIG. 11 shows the result thereof. As is apparent from FIG. 11, ratios (local minimum value/local maximum value) between a local maximum value and a local minimum value that were adjacent on the long wavelength side were each 0.5 or more.

Table 1 shows minimum value of ratios obtained in the above described Examples 1 to 9 in cases where, at the wavelengths between 350 to 780 nm, with respect to a local maximum value of the light emission intensity, there is a local minimum value of the light emission intensity that is closest to the local maximum value on the long wavelength side, and a ratio (local minimum value/local maximum value) of the local minimum value with respect to the local maximum value when the local maximum value is taken as 1 is determined.

TABLE 1

| Sample No. | Minimum Value of Ratio (Local Minimum Value/ Local Maximum Value) |
|---|---|
| Example 1 | 0.54 |
| Example 2 | 0.53 |
| Example 3 | 0.94 |
| Example 4 | 0.53 |
| Example 5 | 0.81 |
| Example 6 | 0.73 |
| Example 7 | 0.80 |
| Example 8 | 0.74 |
| Example 9 | 0.67 |

Comparative Examples 1 to 2

Figure 2:
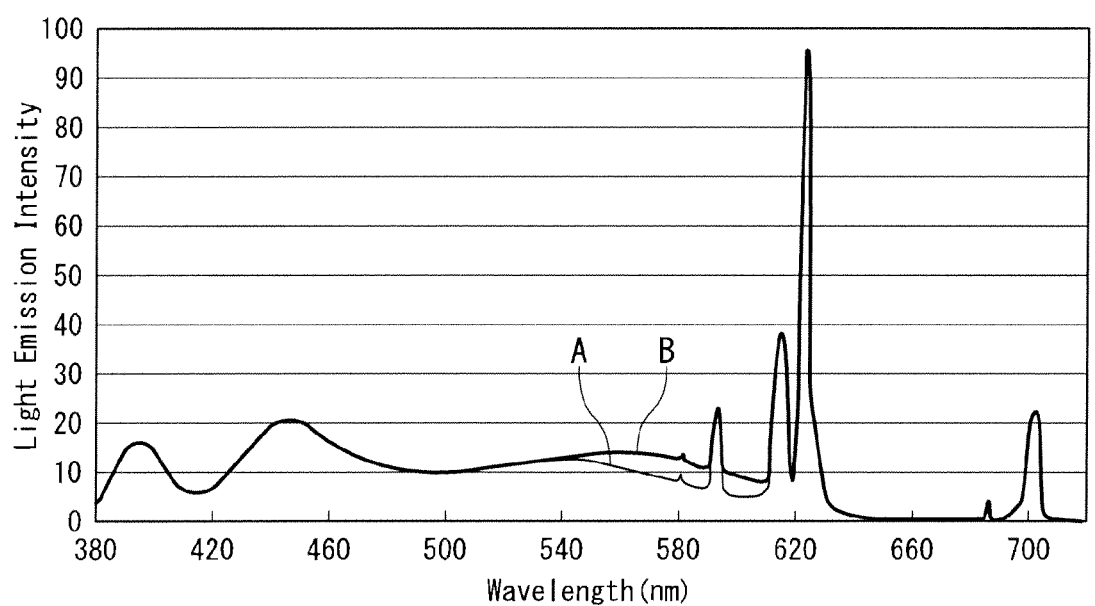
FIG. 2 is a graph showing a light emission spectrum of a white light source in Patent Document 2.

A one-chip type white light source having the light emission spectrum illustrated in FIG. 1 was prepared as Comparative Example 1, and a one-chip type white light source having the light emission spectrum illustrated in FIG. 2 was prepared as Comparative Example 2. The respective light emission spectrums for Comparative Example 1 and Comparative Example 2 each included a portion at which a difference between a local maximum value and a local minimum value that were adjacent on the long wavelength side exceeded 0.5.

Examples 1A to 9A and Comparative Examples 1A to 2A

Using the white light sources of Examples 1 to 9 and Comparative Examples 1 to 2, a color rendering index (R9) showing the brightness of red light was measured. The measurement results are shown in Table 2, hereunder.

TABLE 2

| Sample No. | White Light Source | R9 |
|---|---|---|
| Example 1A | Example 1 | 97 |
| Example 2A | Example 2 | 96 |
| Example 3A | Example 3 | 99 |

TABLE 2-continued

| Sample No. | White Light Source | R9 |
| --- | --- | --- |
| Example 4A | Example 4 | 71 |
| Example 5A | Example 5 | 83 |
| Example 6A | Example 6 | 88 |
| Example 7A | Example 7 | 73 |
| Example 8A | Example 8 | 82 |
| Example 9A | Example 9 | 82 |
| Comparative Example 1A | Comparative Example 1 | −20 |
| Comparative Example 2A | Comparative Example 2 | 49 |

To confirm whether an object is seen with the same color tones as in the case of sunlight, it is necessary to perform an evaluation using not only the general color rendering index Ra, but also a special evaluation index Ri (i=9 to 15). Since the saturation in a color chart used for special color rendering evaluation is high in comparison to a color chart used for general color rendering evaluation, and a high saturation region is also necessary to perform a color evaluation such as evaluation of color reproducibility, it is necessary to use not only a general color rendering index but also the index Ri in combination therewith. The index R9 that is typically used among the special color rendering evaluation indices was used in the present examples.

As is apparent from the results shown in Table 2, it was found that the white light sources according to the present examples exhibit excellent characteristics.

The white light source exhibiting R9 as described above is suitable as a white light source that is used for task illumination, for illuminating any one or more kinds among printed matter, foodstuff, and a human, and for illumination when a distance to an object of irradiation is 1.5 m or less.

Examples 10 to 20 and Comparative Examples 3 to 4

Next, light emission apparatuses (white light sources) according to respective examples and comparative examples were prepared as described below, and tests were conducted to check the influence on the human body of thus obtained light sources. With regard to the test light sources of the examples and comparative examples, a sensory evaluation was conducted with respect to whether or not people felt uncomfortable when exposed to light of the respective light sources at the same intensity of illumination.

White light sources having the same configuration as in Comparative Examples 1 and 2 were used as the light emission apparatuses according to Comparative Examples 3 and 4. Further, the light emission apparatuses according to Examples 10 to 20 were constructed as described hereunder.

That is, LED chips each having a light emission peak wavelength of 380 nm were prepared. Next, there was prepared a mixture including: a europium-activated alkaline-earth phosphate blue phosphor having a peak wavelength of 445 nm; a europium-activated strontium aluminate blue-green phosphor having a peak wavelength of 490 nm; a europium-activated β-sialon green phosphor having a peak wavelength of 540 nm; a europium-activated orthosilicate yellow phosphor having a peak wavelength of 555 nm; and a europium-activated strontium sialon red phosphor having a peak wavelength of 630 nm, as phosphors that emitted light while being irradiated with electromagnetic waves of 380 nm.

The average particle size of the phosphors was set to 13 μm. Each phosphor mixture and silicone resin were mixed, and the resulting mixtures were then applied, respectively, to the globe inner surface whereby a bulb-type white light source having the same structure as the white light source illustrated in FIG. 12 was manufactured. Note that by diversely changing the mixing ratio of each phosphor, as shown in Table 3, a variety of white light sources for which the respective correlated color temperatures of light emission color were in a range of 2,800 K to 6,500 K were manufactured and used as Examples 10 to 18. Further, as Example 19, mixed phosphors were used in which the content of the blue phosphor component was made extremely small. In addition, mixed phosphors from which a phosphor component having a light emission peak in a blue region was removed were used as Example 20. The thickness of the phosphor layer in each example was set to 0.2 mm.

The light emission spectrum of each of the white light sources according to Examples 10 to 20 and Comparative Examples 3 to 4 constructed in the above manner was checked according to total luminous flux measurement using an integrating sphere in a similar manner to Example 1. It was confirmed that, in the shape of each of the light emission spectrums of Examples 10 to 20, ratios (local minimum value/local maximum value) between a local maximum value and a local minimum value that were adjacent on the long wavelength side were 0.5 or more.

Next, the maximum intensity of light emission spectrums in a violet to blue region (380 to 490 nm) in visible light (380 nm to 780 nm) was measured, and the measured maximum intensity and the intensity of the black-body radiation spectrum at the same wavelength as the wavelength exhibiting the maximum intensity were compared. At such time, the light emission spectrums used for the comparison were as follows. Taking the light emission spectrum of the light source of the present invention as $A(\lambda)$, the spectrum of black-body radiation having the same color temperature as that of the light source of the present invention as $B(\lambda)$, and the spectrum of a spectral luminous efficiency as $V(\lambda)$, spectrums of $A(\lambda)$ and $B(\lambda)$ that satisfy $\int A(\lambda) \cdot V(\lambda) d\lambda = \int B(\lambda) \cdot V(\lambda) d\lambda$ were determined, and the shapes of the two spectrums of $A(\lambda)$ and $B(\lambda)$ were compared. An intensity ratio (A*/B*) was calculated for a region from 380 to 490 nm of the light emission spectrum $A(\lambda)$, assuming that: a wavelength at which the spectrum intensity is a maximum is $\lambda^*$, the maximum intensity is A*, and the spectrum intensity of $B(\lambda)$ at the wavelength $\lambda^*$ is B*. Table 3 shows the calculation results.

Next, the bulb-type white light sources according to Examples 10 to 20 and Comparative Examples 3 to 4 were turned on in front of 100 subjects, and there was performed a sensory evaluation test regarding how the respective light sources were visually perceived. The subjects were selected by random sampling and comprised 10 men and 10 women in each of the age brackets of 10 to 25, 26 to 40, 41 to 55, 56 to 70, and 71 and over, who were requested to take part in the test. The subjects were asked to evaluate how each of the light sources was visually perceived by ranking the respective light sources into one of the following five grades: ■ comfortable, ■ not uncomfortable, ■ has an uncomfortable feeling, ■ uncomfortable, and ■ extremely uncomfortable.

Table 3 shows a summary of the light emission characteristics and sensory evaluation results with respect to the white light sources according to Examples 10 to 20 and Comparative Examples 3 to 4. Note that, with respect to the method used to describe the results of the sensory evaluation test, the characteristic of the rank selected most among the evaluations of the 100 people is described. The number of respondents who selected the rank in question is shown in parentheses.

TABLE 3

| Sample No. | Color Temperature (K) | Ratio (Local Minimum Value/ Local Maximum Value) | λ*(nm) | Ratio (A*/B*) | Visual Perception of Light Source |
|---|---|---|---|---|---|
| Example 10 | 5000 | 0.55 | 450 | 1.70 | Uncomfortable(45) |
| Example 11 | 2800 | 0.60 | 490 | 1.56 | Uncomfortable(35) |
| Example 12 | 2800 | 0.70 | 490 | 1.50 | Uncomfortable Feeling(43) |
| Example 13 | 4250 | 0.95 | 490 | 1.35 | Not Uncomfortable(38) |
| Example 14 | 4000 | 0.70 | 470 | 1.20 | Not Uncomfortable(33) |
| Example 15 | 5000 | 0.90 | 455 | 1.15 | Comfortable(32) |
| Example 16 | 5200 | 0.70 | 470 | 1.12 | Comfortable(40) |
| Example 17 | 6500 | 0.85 | 450 | 1.10 | Comfortable(38) |
| Example 18 | 3000 | 0.85 | 490 | 1.10 | Comfortable(43) |
| Example 19 | 2800 | 0.98 | 490 | 1.05 | Comfortable(48) |
| Example 20 | 2900 | 0.90 | 490 | 0.95 | Comfortable(51) |
| Comparative Example 3 | 5000 | 0.30 | 450 | 2.47 | Extremely Uncomfortable(36) |
| Comparative Example 4 | 2800 | 0.20 | 448 | 2.03 | Uncomfortable(52) |

As is apparent from the results shown in the above Table 3, in the evaluation regarding how the light sources were visually perceived, the light sources were clearly determined as being uncomfortable when the intensity ratio (A*/B*) exceeded 1.5, the uncomfortable feeling gradually lessened as the value of the intensity ratio (A*/B*) decreased to 1.5 or less, and the number of subjects that evaluated the light sources as comfortable increased when the intensity ratio was around 1.0. Thus, it was confirmed by the present examples that a favorable light source that does not impart an uncomfortable feeling to humans is obtained when the intensity of a blue light component is close to or lower than the intensity thereof in the spectrum of black-body radiation.

INDUSTRIAL APPLICABILITY

According to the white light source and the white light source system of the present invention, since bumps and dips are reduced in the light emission spectrum, color tones of an object can be perceived in the same way as when the object is irradiated with sunlight.

REFERENCE SIGNS LIST

1 . . . LED bulb (white light source)
1a . . . white light source system
2, 2a . . . LED module
3 . . . base body
4 . . . globe
5 . . . insulating member
6 . . . cap
7 . . . substrate
8, 8a, 8b, 8c . . . LED chip
9 . . . phosphor layer
10 . . . transparent resin layer
11, 11a . . . lighting circuit
12, 12a . . . wiring line

The invention claimed is:

1. A white light source that is used for task illumination, comprising:
a light emitting diode having a light emission peak wavelength of 350 to 490 nm; and
a phosphor that emits visible light upon excitation by a light emitted from the light emitting diode;
wherein, with respect to all local maximum values of light-emission intensity between 350 and 780 nm of a light emission spectrum of the white light source, a ratio of a local minimum value of light-emission intensity that is closest on a long wavelength side to the local maximum value is such that, when the local maximum value is taken as 1, the local minimum value is 0.7 or more,
wherein a local maximum value accompanying with a local minimum value at a shorter wavelength side does not exist at a wavelength range of 600 nm to 700 nm, and
wherein a maximum peak intensity of the light emission spectrum of the white light source is within a range of 491 to 780 nm.

2. The white light source according to claim 1, wherein a color temperature of white light is between 2,500 and 7,000 K.

3. The white light source according to claim 1, wherein, with respect to the light emission spectrum of the white light source and a light emission spectrum of black-body radiation having a same color temperature as that of the white light source, in a case where both light emission spectrums are compared in a case in which visual luminances are made identical, a maximum light emission intensity of a light emission spectrum of a violet to blue region (380 to 490 nm) of the white light source is an intensity that is less than or equal to 1.5 times a light emission intensity of the black-body radiation spectrum of a same wavelength as a wavelength that exhibits the maximum light emission intensity.

4. The white light source according to any one of claims 1, 2 and 3, comprising three or more types of phosphors having different light emission peak wavelengths.

5. The white light source according to any one of claims 1, 2 and 3 comprising at least one or more regions at which light emission spectrums of the light emitting diode and three or more types of phosphors having different light emission peak wavelengths overlap.

6. The white light source according to any one of claims 1, 2 and 3, comprising a phosphor for which a half-value width of a light emission spectrum is 50 nm or more.

7. The white light source according to any one of claims 1, 2 and 3 wherein the white light source is used in illumination for illuminating any one kind or more of printed matter, foodstuff, and a human as an object of irradiation.

8. The white light source according to any one of claims 1, 2 and 3 wherein a distance between the white light source and an object of irradiation is 1.5 m or less.

9. A white light source system in which a plurality of white light sources according to any one of claims 1, 2 and 3 are provided.

* * * * *